US009450592B2

(12) United States Patent
Maheshwari et al.

(10) Patent No.: US 9,450,592 B2
(45) Date of Patent: Sep. 20, 2016

(54) FREQUENCY CONTROL SYSTEM WITH DUAL-INPUT BIAS GENERATOR TO SEPARATELY RECEIVE MANAGEMENT AND OPERATIONAL CONTROLS

(75) Inventors: Atul Maheshwari, Portland, OR (US); Parker J. Rachel, Forest Grove, OR (US); Kuan-Yueh James Shen, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/977,424

(22) PCT Filed: Apr. 13, 2012

(86) PCT No.: PCT/US2012/033612
§ 371 (c)(1), (2), (4) Date: Aug. 1, 2014

(87) PCT Pub. No.: WO2013/154585
PCT Pub. Date: Oct. 17, 2013

(65) Prior Publication Data
US 2014/0340129 A1 Nov. 20, 2014

(51) Int. Cl.
*H03L 7/08* (2006.01)
*H03L 7/16* (2006.01)
*H03L 7/089* (2006.01)
(Continued)

(52) U.S. Cl.
CPC ............... *H03L 7/16* (2013.01); *H03L 7/0802* (2013.01); *H03L 7/0893* (2013.01); *H03L 7/0895* (2013.01); *H03L 7/1072* (2013.01);
(Continued)

(58) Field of Classification Search
CPC . H03L 7/0802–7/0807; H03L 7/0895–7/0898
See application file for complete search history.

(56) References Cited

U.S. PATENT DOCUMENTS 4,663,584 A * 5/1987 Okada .................. H03H 11/245 323/313
5,319,320 A * 6/1994 Abe .................. G11B 20/1403 331/1 A (Continued)

FOREIGN PATENT DOCUMENTS

WO 2013/154585 A1 10/2013

OTHER PUBLICATIONS

Office Action received for Taiwanese Patent Application No. 102206498, mailed on Feb. 14, 2014, 4 pages of Taiwanese Office Action only.

(Continued)

*Primary Examiner* — Thomas J Hiltunen
(74) *Attorney, Agent, or Firm* — Garrett IP, LLC

(57) ABSTRACT

Methods and systems to control an output frequency relative to a reference frequency. A frequency control system includes a dual-input bias generator to separately receive management and operational controls. The bias generator includes a first bias generator circuit to generate a bias control based on a difference between the management control and a bias feedback reference during a first mode of operation, a second bias generator circuit to generate the bias control based on a difference between the operational control and the bias feedback reference during a second mode of operation, and a bias feedback reference circuit to generate the bias feedback reference based on the bias control. The first mode may include a characterization and/or a start-up mode. The second mode may include an operational mode, such as a feedback-controlled mode.

26 Claims, 5 Drawing Sheets

(51) Int. Cl.
*H03L 7/107* (2006.01)
*H03L 7/099* (2006.01)
*H03L 7/093* (2006.01)

(52) U.S. Cl.
CPC .............. *H03L 7/093* (2013.01); *H03L 7/099* (2013.01); *H03L 2207/06* (2013.01)

(56) References Cited

U.S. PATENT DOCUMENTS 5,783,956 A * 7/1998 Ooishi .......................... 327/157
5,870,003 A 2/1999 Boerstler
6,407,600 B1 * 6/2002 Lu ......................... H03L 7/0891 327/156
6,812,754 B1 * 11/2004 Nakanishi ............ H03L 7/0895 327/148
6,922,047 B2 7/2005 Knoll et al.
6,937,075 B2 8/2005 Lim et al.
7,064,621 B2 * 6/2006 Nakanishi ............ H03K 3/0315 331/11
7,082,177 B2 * 7/2006 Arkiszewski ................. 375/376
7,099,643 B2 * 8/2006 Lin ......................... H03L 7/097 455/147
7,199,673 B2 * 4/2007 Erdogan ................. H03L 7/093 331/14
7,251,305 B2 * 7/2007 Gauthier et al. .............. 375/376
7,466,174 B2 * 12/2008 Tirumalai ............ H03L 7/0893 327/142
7,746,132 B2 * 6/2010 Okamoto ................ H03L 7/085 327/147
7,991,694 B2 * 8/2011 Takayama ....................... 705/41
8,085,098 B2 * 12/2011 Yamazaki ....................... 331/10
8,134,392 B2 * 3/2012 Kawamoto ................... 327/156
8,134,393 B1 * 3/2012 Nagaraj et al. ............... 327/156
8,174,332 B1 * 5/2012 Lombaard ............. H03L 7/0893 327/156
8,513,992 B1 * 8/2013 Majumder et al. ........... 327/157
8,643,414 B1 * 2/2014 Navid ........................... 327/156
2004/0135640 A1 7/2004 Maneatis
2004/0151271 A1 * 8/2004 Krueger .................... G06F 1/04 375/376
2009/0042528 A1 * 2/2009 Pellerano et al. ............ 455/260
2011/0221489 A1 * 9/2011 Tarng ...................... H03L 7/087 327/156
2014/0312945 A1 * 10/2014 Ippili ................. H03K 19/0175 327/157

OTHER PUBLICATIONS

Office Action received for Taiwanese Patent Application No. 102206498, mailed on Dec. 12, 2013, 6 pages of Taiwanese Office Action only.
International Search Report and Written Opinion Received for PCT patent Application No. PCT/US2012/033612, mailed on Dec. 14, 2012, 8 pages.
International Preliminary Report on Patentability and Written Opinion recieved for PCT Patent Application No. PCT/US2012/033612, mailed on Oct. 23, 2014, 5 pages.

* cited by examiner

FREQUENCY CONTROL SYSTEM WITH DUAL-INPUT BIAS GENERATOR TO SEPARATELY RECEIVE MANAGEMENT AND OPERATIONAL CONTROLS

BACKGROUND

A phase locked loop (PLL) may include a phase detector, loop filter, VCO, reference input, and frequency divider. After an initial power-on, the PLL may perform a lock acquisition process in to attempt to phase and/or frequency lock a VCO output to the reference input. Lock acquisition may take time due to an indeterminate state of the PLL at power-on.

A PLL may be calibrated or characterized to determine or generate a frequency versus tuning voltage curve for the VCO, which may be used to optimize PLL operation. Characterization may include comparing a range of voltages applied to the bias generator, to corresponding output frequencies of the VCO.

BRIEF DESCRIPTION OF THE DRAWINGS/FIGURES

Figure 1:
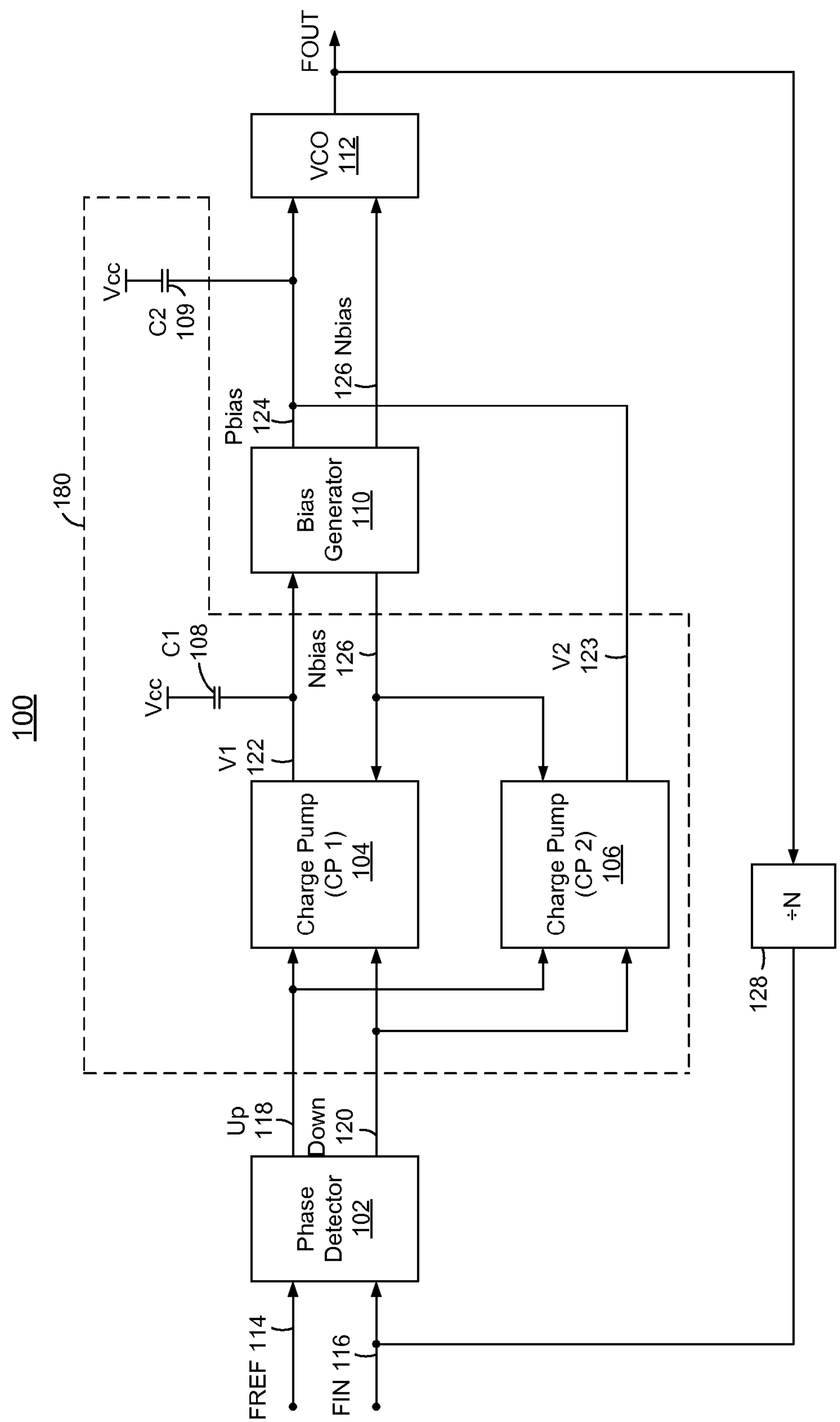
FIG. 1 is a block diagram of a frequency control system including a bias generator to generate one or more bias controls to control an output frequency relative to a reference frequency.

In the drawings, the leftmost digit(s) of a reference number identifies the drawing in which the reference number first appears.

DETAILED DESCRIPTION

FIG. 1 is a block diagram of a frequency control system 100, including a bias generator 110 to generate one or more bias controls to control an output frequency, FOUT, relative to a reference frequency FREF 114.

In the example of FIG. 1, system 100 includes a phase detector 102, charge pumps 104 and 106, loop filters 108 and 109, a voltage-controlled oscillator (VCO) 112, and a frequency divider 228. Frequency control system 100 may represent a phase locked loop (PLL). For illustrative purposes, frequency control system 100 is illustrated as a self-biased phase locked loop (SBPLL). Methods and systems disclosed herein are not, however, limited to SBPLLs or PLLs.

Bias generator 110 is implemented to generate bias controls Nbias 126 and Pbias 124. Nbias 126 is provided to VCO 112 and charge pumps 104 and 106. Pbias 124 is provided to VCO 112.

Charge pumps 104 and 106 may be implemented to vary corresponding output current drives based on Nbias 126.

Phase detector 102 may be implemented to compare a reference clock, input FREF 114, and a feedback clock, input FIN 116, and to control or assert an Up control 118 and/or a Down control 120 based on a phase difference. Phase detector 102 may generate a pulse width having a width substantially equal to the phase difference. The pulse may be provided as Up control 118 when FREF leads FIN, and as Down control 120 when FREF lags FIN. In the example of FIG. 1, Up control 118 and Down control 120 are provided to charge pumps 104 and 106.

Charge pump 104 generates and/or regulates an operating control V1 122 110 based on Up control 118 and Down control 120.

Figure 4:
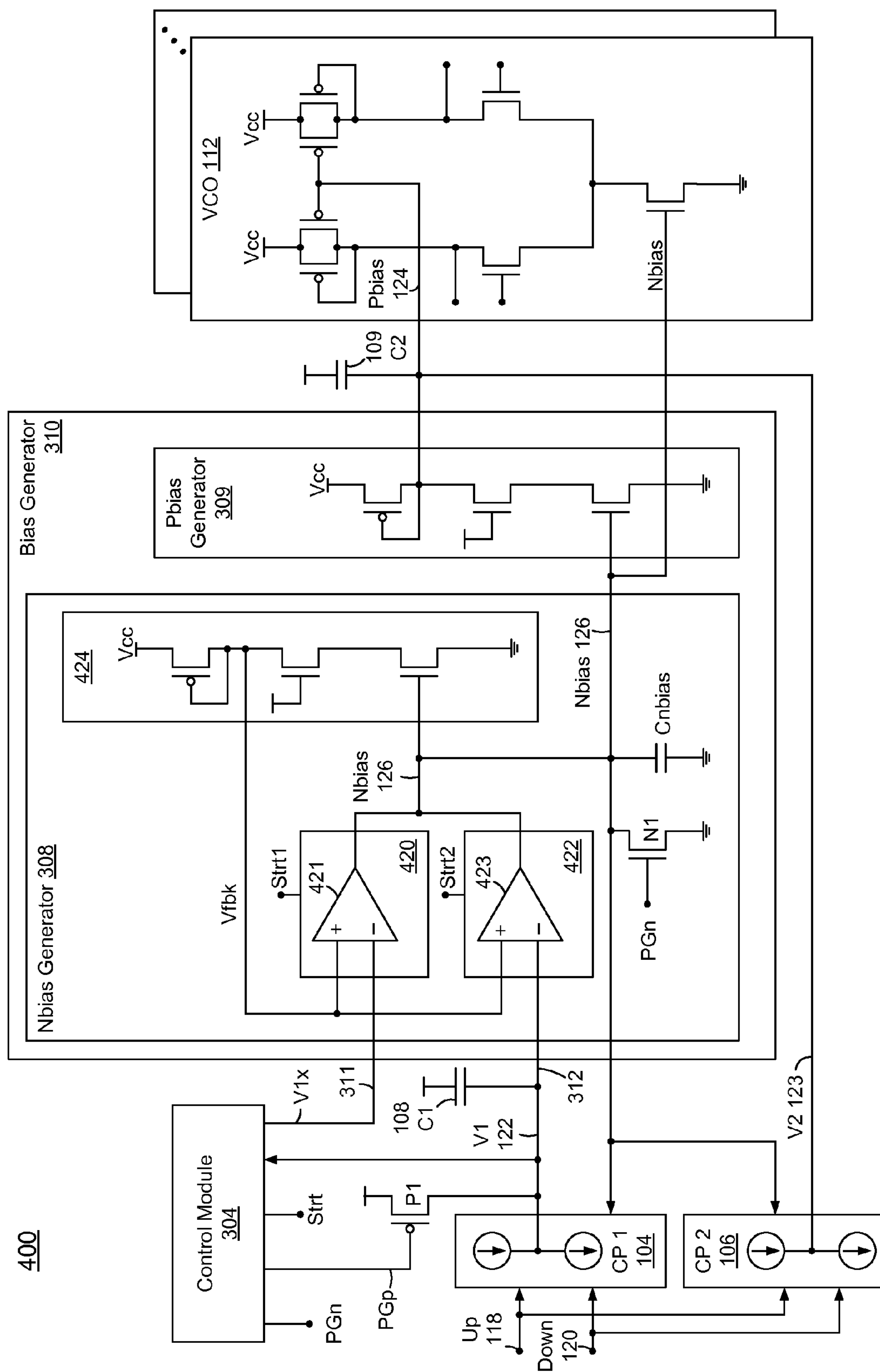
FIG. 4 is a circuit diagram of an example implementation of the frequency control system of FIG. 3, where the bias generator includes an Nbias generator and a Pbias generator, and where the Nbias generator includes first and second bias generator circuits and a bias feedback reference circuit.

Charge pump 106 generates and/or regulates a control V2 123, which may be further regulated as Pbias 124 by bias generator 110, such as illustrated in FIG. 4 with a Pbias generator 309.

In FIG. 1, loop filters 108 and 109 include capacitors C1 and C2, each to filter a corresponding one of V1 122 and V2 123/Pbias 124. Loop filter 108 and 109 may include low-pass filters. Loop filter 108 may be implemented to integrate current generated by charge pump 104, such as to smooth operational control V1 122. Loop filter 109 may be implemented to integrate current generated by charge pump 106, such as to smooth V2 123.

Charge pumps 104 and 106 and loop filters 108 and 109 may define a loop filter circuit 180 to translate an output of phase detector 102 into an operational control or control voltage. Loop filter circuit 180 is not, however, limited to the example of FIG. 1, as one or more features of loop filter circuit 180 may be omitted and/or replaced with other components. In an embodiment, one or both of charge pumps 104 and 106, and/or loop filters 108 and 109 may be replaced with one or more other loop filter components. For example, one or more of loop filters 108 and 109 may be replaced with sample-reset type filters. As another example, charge pump 104 may be replaced with a sample and hold circuit, a counter, a passive component, and/or combinations thereof. In such embodiments, a control module may assert appropriate control over the loop filter circuit components to implement features disclosed herein.

System 100 may be implemented to operate in a closed-loop feedback-controlled mode to control and/or minimize phase and/or frequency differences between FREF 114 and FIN 116, such as to lock the frequency and/or phase of FIN 116 with that of FREF 114. A feedback loop may include phase detector 102, charge pumps 104 and 106, loop filters 108 and 109, bias generator 110, VCO 112, and divider 128. The closed-loop feedback-controlled mode may also be referred to as a feedback-controlled mode and an operating mode of system 100.

Upon power-up of system 100, one or more loop signals may have an indeterminate and/or known state that differs from a desired state. In time, and without assistance, bias generator 110 may converge on bias levels to lock the frequency and/or phase of FREF 116 with that of FIN 116.

Described below are methods and systems to selectively implement a startup mode prior to the feedback controlled mode, such as to reduce the lock or acquisition time after power-on. Also described below are methods and systems to selectively implement a characterization mode, such as to perform a frequency versus tuning voltage (FV) characterization or calibration of VCO 112.

A frequency control system as disclosed herein may be configurable to operate in multiple modes. A first mode may include the start-up mode and/or the characterization mode during which bias generator 110 receives a management control. A second mode may include the feedback-controlled mode during which bias generator 110 receives a feedback control, illustrated here as operational control V1 122.

Figure 2:
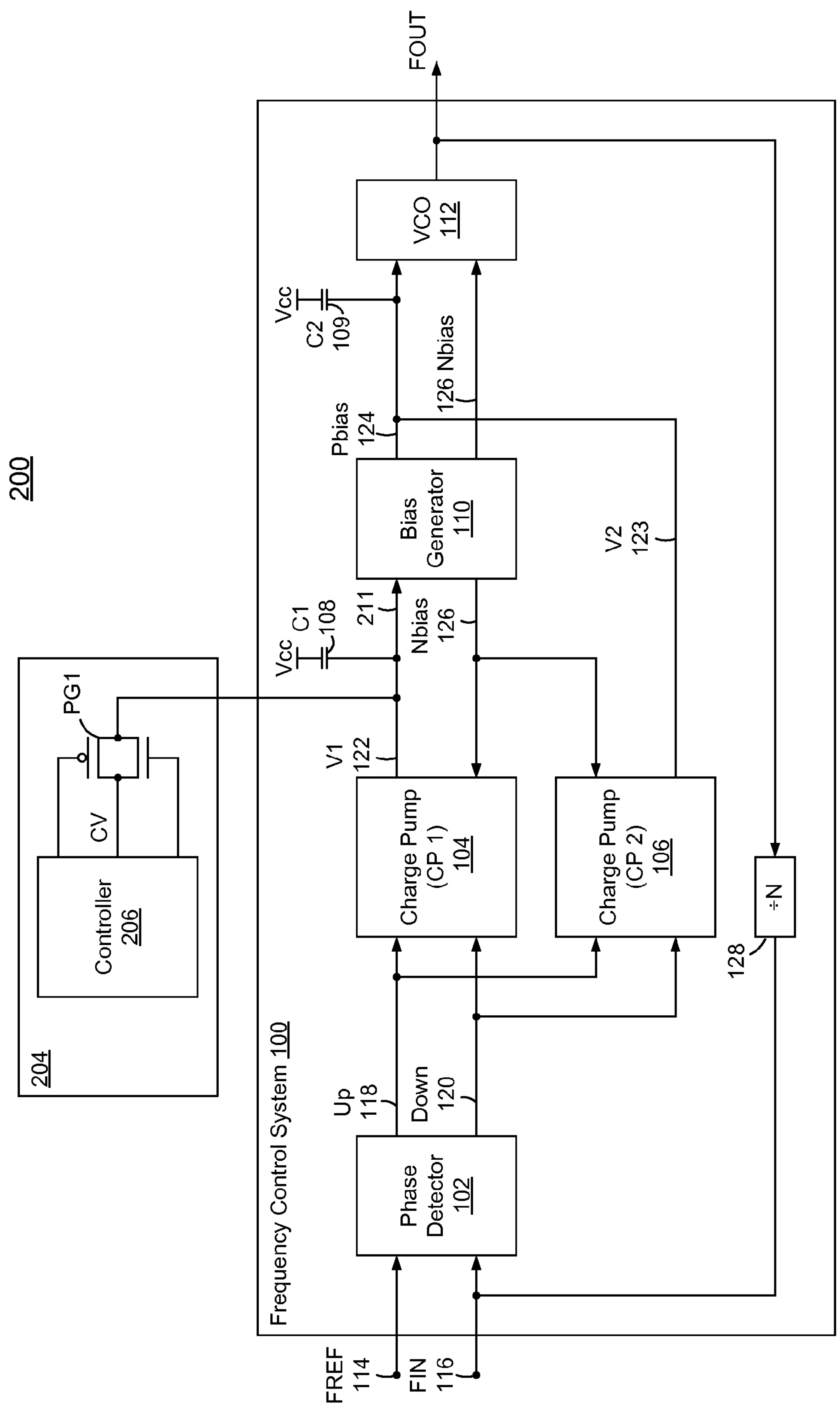
FIG. 2 is a block diagram of the frequency control system of FIG. 1, where the bias generator includes a single input to receive a management control and an operational control.

FIG. 2 is a block diagram of a frequency control system 200, including frequency control system 100 of FIG. 1 and a management control module 204 having a controller 206 to generate management control CV.

In FIG. 2, bias generator 110 includes a single input 211 to receive management control CV during the first mode of operation and operational control V1 122 during the second mode of operation.

Control module 204 may further include a switch device, illustrated here as a pass gate PG1, to provide management control CV to input 211. Controller 206 may be implemented to control PG1 to selectively provide management control CV to input 211 during the first mode of operation. Charge pump 104 may be disabled during the first mode of operation.

When PG1 is open, system 100 may operate in the second mode of operation, or feedback-controlled mode, to provide operational control V1 122 to input 211 of bias generator 110.

Where the first mode includes the FV characterization mode, controller 206 may increment management control CV through a tuning range of voltages, which may include voltages between zero volts and an operating voltage, Vcc, of system 100. Corresponding frequencies and/or phases of FOUT may be monitored and/or recorded to generate FV characteristics, which may be used to calibrate system 100 and/or another frequency control system.

Where the first mode includes the start-up mode, controller 206 may set management control CV to a nominal tuning voltage, which may be approximately midway between Vss and Vcc. Thereafter, power may be applied to charge pump 104 and PG1 may be opened to operate system 100 in the feedback-controlled mode.

In the feedback-controlled mode, where PG1 is open, a leakage current may flow through PG1, which may offset operational control V1 122. Charge pump 104 may compensate for the offset, but the compensation may result in a static phase error. Excessive leakage may preclude frequency and/or phase locking.

Figure 3:
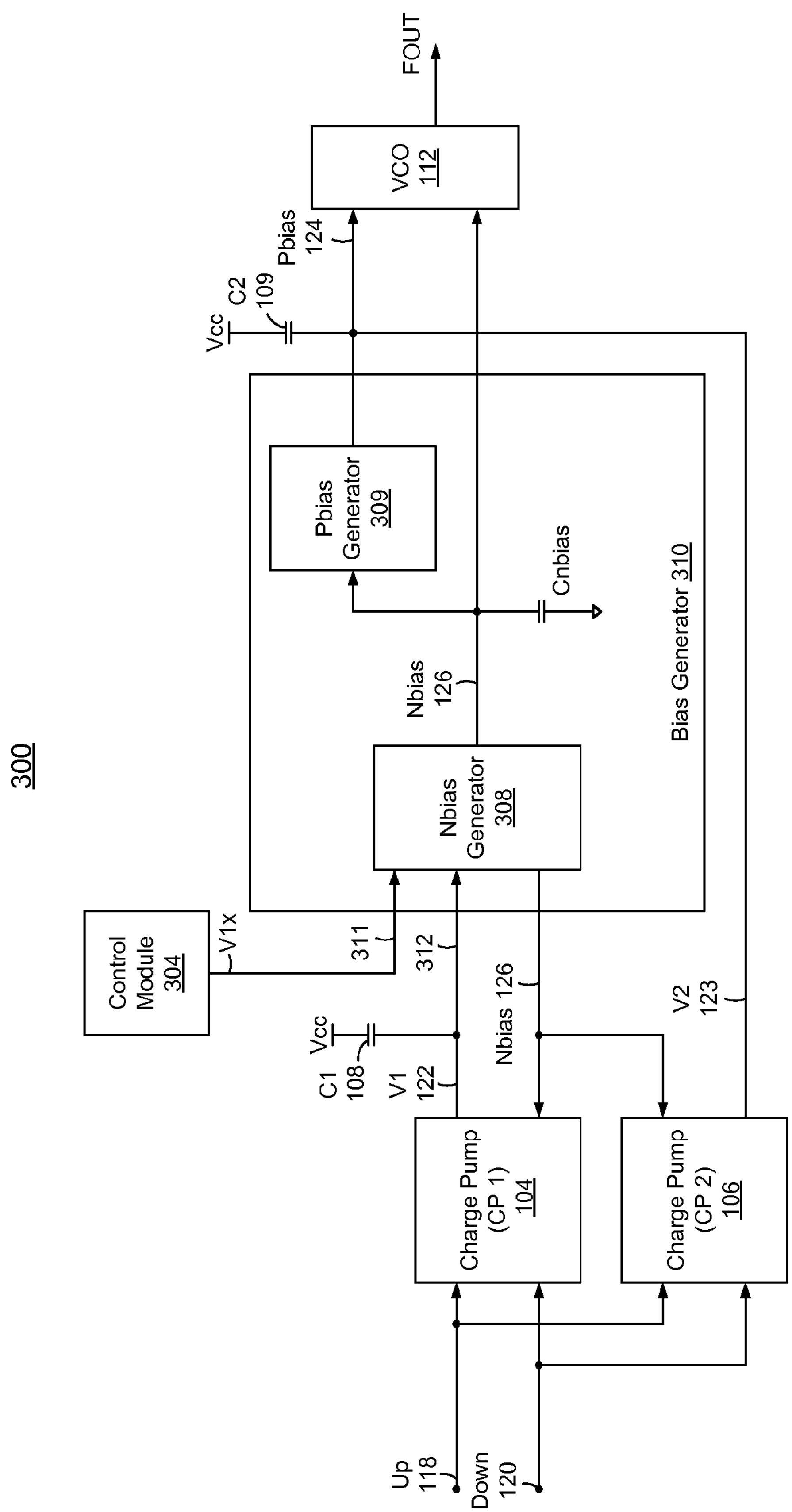
FIG. 3 is a block diagram of another frequency control system including a bias generator having a first input to receive a management control during a first mode of operation and a second input to receive an operational control during a second mode of operation.

FIG. 3 is a block diagram of a frequency control system 300, including a bias generator 310 having a first input 311 to receive a management control Vlx from a control module 304 during the first mode of operation, and a second input 312 to receive operational control V1 122 during the second mode of operation. In other words, bias generator 310 is implemented to receive management control Vlx and operational control V1 122 via separate paths, which may reduce and/or eliminate the current leakage flow described above with reference to FIG. 2.

Bias generator 310 may be implemented to receive management control Vlx during the first mode of operation and to receive operational control V1 122 during the second mode of operation, and to control bias control Nbias 126 during each of the first and second modes to control output frequency FOUT. Management control V1x may include a start-up control and/or a FV characterization control, such as described above.

System 300 further includes charge pumps 104 and 106, and VCO 112, as described above with reference to system 100. For ease of illustration, phase detector 102 and divider 108 are omitted in FIG. 3.

In FIG. 3, bias generator 310 includes an Nbias generator 308 to generate Nbias 126 based on one of inputs 311 and 312, and a Pbias generator 309 to control Pbias 124 based on Nbias 126. Bias generator 310 further includes a capacitor Cnbias connected to an electrical path of Nbias 126 and to a voltage reference Vss, which may correspond to ground.

FIG. 4 is a circuit diagram 400 of an example implementation of system 300.

In FIG. 4, Nbias generator 308 includes a first bias Nbias generator circuit 420, a second bias generator circuit 422, and a bias feedback reference circuit 424.

First Nbias generator circuit 420 may be implemented to generate Nbias 126 based on a difference between management control Vlx and a bias feedback reference Vfbk from bias feedback reference circuit 424.

Second Nbias generator 420 may be implemented to generate Nbias 126 based on a difference between operational control V1 122 and bias feedback reference Vfbk.

Bias feedback reference circuit 424 may be implemented to generate bias feedback reference Vfbk based on Nbias 126.

Control module 304 may be implemented to selectively enable one of first and second Nbias generator circuits 420 and 422 with corresponding controls Strt1 and Strt2, to generate Nbias 124 based on a corresponding one of management control Vlx and operational control V1 122.

First bias generator circuit 420 may include an operational amplifier (OpAmp) 421 to receive and compare management control Vlx and bias feedback reference Vfbk.

Second bias generator 422 may include an operational amplifier (OpAmp) 423 to receive and compare operational control V1 and bias feedback reference Vfbk.

OpAmp 421 may be implemented or fabricated with a smaller scale process technology (i.e., smaller channel length, smaller channel width, and/or smaller feature size), than OpAmp 423. A larger scale process for OpAmp 423 may help to reduce device noise and offsets during the feedback-controlled mode. Device noise and offsets may be of little or no concern in FV characterization mode and/or start-up mode, and a smaller scale process technology for OpAmp 421 may help to conserve power and/or area. Example implementations of OpAmps 421 and 423 are described further below with reference to FIG. 5.

One or more elements of system 300 may be controllable to be placed in a reduced power-consumption state. In the example of FIG. 4, circuit diagram 400 includes gates N1 and P1, which may be referred to as power gates, to place bias generator 310 in a reduced power-consumption state. Gate N1 may represent an N-type device to pull-down Nbias 126 to Vss responsive to a PGn control, to effectively turn-off charge pumps 104 and 106. Gate P1 may represent a P-type device to pull-up V1 122 to Vcc responsive to a PGp control, which may help to prevent oscillations within bias generator 310. Controls PGn and PGp may be generated by control module 304.

To enter the FV characterization mode from the reduced power-consumption mode, gate N1 may be opened, gate P1 may remain closed, first bias generator circuit 420 may be enabled with Strt1, and second bias generator circuit 422 may be disabled with Strt2. Management control V1x may then be incremented by control module 304 to cause first bias generator circuit 420 to generate Nbias 126 based on management control V1x and Vfbk. Calibration data may be collected as described above.

To transition from the FV characterization mode to the start-up mode, gate P1 may be opened, first bias generator circuit 420 may be enabled with Strt1, and second bias generator circuit 422 may be disabled with Strt2.

To enter the start-up mode directly from the reduced power-consumption mode, gates N1 and P1 may be opened, first bias generator circuit 420 may be enabled with Strt1, and second bias generator circuit 422 may be disabled with Strt2.

When gate P1 is closed, Vcc may be applied to input 312 through capacitor C1 108. When gate P1 is initially opened, charge within capacitor C1 108 may hold input 312 at Vcc. In start-up mode, control module 304 may be implemented to control charge pump 104 to cause charge pump 104 to draw charge from capacitor C1 108, which may reduce the voltage at input 312.

For example, control module 304 may be implemented to assert Down control 120 until operational control V1 122 on input 312 reaches a nominal value, referred to herein as a reference startup voltage, Vstrtup. Vstrtup may correspond to a midpoint between Vss and Vcc. Assertion of Down control 120 may include pulling Down control 120 to Vss. Assertion of Down control 120 may cause charge pump 104 to draw charge from C1 108. The nominal value of operational control V1 122 may drive Nbias 126 to a relatively low voltage, which may cause charge pump 104 to draw a relatively high current from C1 108, which may discharge capacitor C1 relatively quickly.

To transition from the start-up mode to the feedback-controlled mode, first bias generator circuit 420 may be disabled with Strt1, and second bias generator circuit 422 may be enabled with Strt2.

Control module 304 may be implemented to monitor operational control V1 122 as capacitor C1 is discharged through charge pump 104, and to transition to the feedback-controlled mode when operational control V1 122 falls to or below a threshold value. Control module 304 may include, for example, a comparator to receive and compare operational control V1 122 with reference startup voltage Vstrtup. Control module 304 may be implemented to transition to the feedback-controlled mode when operational control V1 122 is equal to or less than Vstrtup.

System 300 may be implemented and/or controllable to transition between any pair of the reduced power-consumption mode, the FV characterization mode, the start-up mode, and the feedback-controlled mode, and may be implemented to traverse through one or more combinations of the modes. For example, and without limitation, system 300 may be implemented to sequentially transition from the reduced power-consumption mode, to the FV characterization mode, to the power-up mode, and to feedback-controlled mode. Alternatively, or additionally, system 300 may be implemented to sequentially transition from the reduced power-consumption mode, to the power-up mode, and to feedback-controlled mode.

Figure 5:
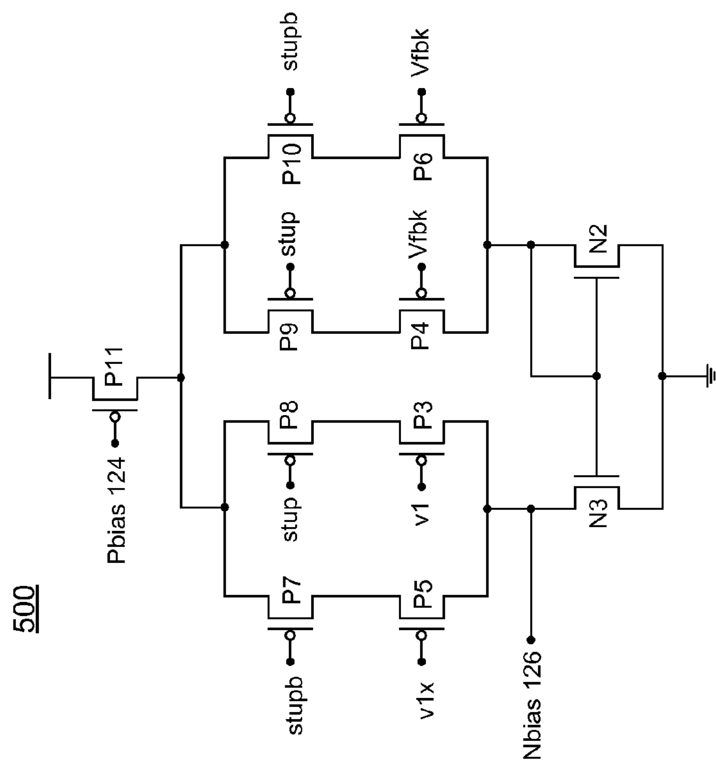
FIG. 5 is a diagram of a circuit in which the first and second bias generator circuits of FIG. 4 are integrated in a differential transistor pair configuration.

FIG. 5 is a diagram of a circuit 500 in which first and second bias generator circuits 420 and 422 are integrated in a differential transistor pair configuration.

Circuit 500 includes a first set of differentially configured p-channel devices P5 and P6, which may represent an example implementation of OpAmp 421 of FIG. 4.

Circuit 500 further includes second set differentially configured p-channel devices P3 and P4, which may represent an example implementation of OpAmp 423 of FIG. 4.

The first and second sets of differentially configured devices may share a load circuit and/or a bias circuit. In FIG. 5, a shared bias circuit is illustrated as a p-channel device P11. A shared load circuit is illustrated as n-channel device N2 and N3. Circuit sharing may help to conserve power and area.

In FIG. 5, complementary OpAmp enable and disable controls, stup and stupb, respectively, may represent controls Strt1 and Strt2 in FIG. 4, and may be controlled to selectively enable and disable corresponding first and second bias generator circuits 420 and 422. For example, when stup is low, or logic 0, P3 and P4 turn on to generate Nbias 126 based on a difference between V1 and Vfbk. When stup is high, or logic 1, the P5 and P6 turn on to generate Nbias 126 based on a difference between V1x and Vfbk.

Methods and systems disclosed herein may be implemented with respect to one or more of a variety of systems such as described below with reference to FIG. 6. Methods and systems disclosed herein are not, however, limited to the example of FIG. 6.

Figure 6:
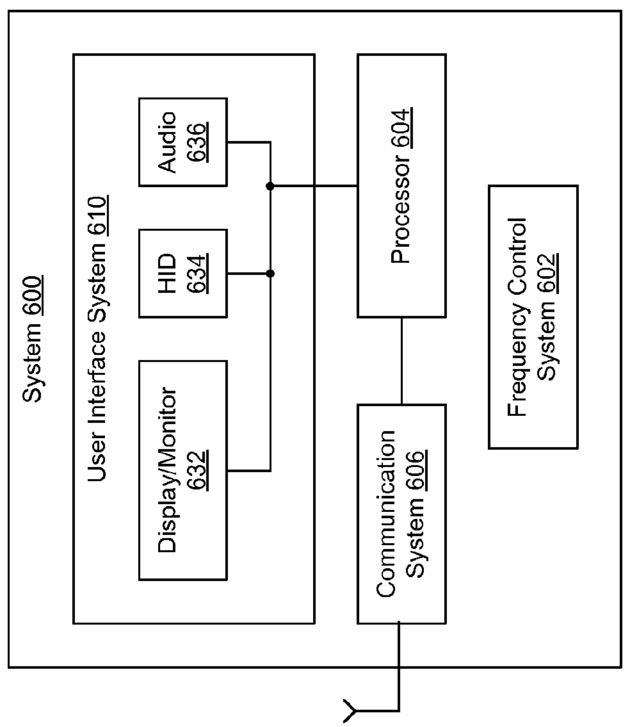
FIG. 6 is a block diagram of a processor-based system that includes a frequency control system.

FIG. 6 is a block diagram of a system 600, including a frequency control system 602 to provide an output frequency as a reference clock to one or more other modules of system 600. Frequency control system 602 may include a bias generator, such as described in one or more examples herein.

System 600 may further include one or more of a processor 604, a communication system 606, a user interface system 610, and communication infrastructure to communicate amongst processor 604, communication system 606, and user interface system 610. Communication system 606 may include a wired and/or wireless communication system.

System 600 or portions thereof may be implemented within one or more integrated circuit dies, and may be implemented as a system-on-a-chip (SoC).

User interface system 610 may include a monitor or display 632 to display information from processor 604 and/or communication system 606.

User interface system 610 may include a human interface device (HID) 634 to provide user input to processor 604 and/or communication system 606. HID 634 may include, for example and without limitation, one or more of a key board, a cursor device, a touch-sensitive device, and or a motion and/or image sensor. HID 634 may include a physical device and/or a virtual device, such as a monitor-displayed or virtual keyboard.

User interface system 610 may include an audio system 636 to receive and/or output audible sound.

System 600 may represent, for example, a computer system, a personal communication device, and/or a television set-top box.

System 600 may include a housing, and one or more of system 602, processor 604, communication system 606, and user interface system 610, or portions thereof may be positioned within the housing. The housing may include, without limitation, a rack-mountable housing, a desk-top housing, a lap-top housing, a notebook housing, a net-book housing, a set-top box housing, a portable housing, and/or other conventional electronic housing and/or future-developed housing. System 600 may further include a battery, and system 600 may be portable.

As disclosed herein, a frequency control apparatus may include a bias generator to control an output frequency during each of first and second modes of operation. The bias generator may include a first input to receive a management control during the first mode of operation and a second input to receive an operational control during the second mode of operation.

The bias generator may include a first bias generator circuit, including the first input to receive the management control, to generate a bias control based on a difference between the management control and a bias feedback reference during the first mode of operation. The bias generator may further include a second bias generator circuit, including the second input to receive the operational control, to generate the bias control based on a difference between the operational control and the bias feedback reference during the second mode of operation. The bias generator may further include a bias feedback reference circuit to generate the bias feedback reference based on the bias control.

The first and second bias generator circuits may each include a respective one of first and second operational amplifiers.

The first and second operational amplifiers may be integrated as a differential transistor pair.

The first and second operational amplifiers may be implemented to share a common load circuit and a common bias circuit.

The first and second operational amplifiers may be implemented on an integrated circuit die, and wherein the first operational amplifier is implemented with one or more of smaller channel lengths, smaller channel widths, and smaller feature sizes, than that of the second operational amplifier.

The frequency control apparatus may include a control module to provide the management control.

The control may be implemented to disable the first bias generator circuit, enable the second bias generator circuit, and provide the management control during the first mode, and to enable the first bias generator and disable the second bias generator during the second mode.

The first mode may include a characterization mode, and the control module may be implemented to provide the management control at each of multiple voltage levels to generate calibration data in the characterization mode.

The first mode may include a start-up mode and the second mode may include a feedback-controlled mode. The frequency control apparatus may include a loop filter circuit, which include a charge pump to provide the operational control during the feedback-controlled mode, and to vary a current drive of the charge pump output based on the bias control. The control module may be implemented to provide the management control during the start-up mode to initialize the charge pump output current drive, and to switch the bias generator from the start-up mode to the feedback-controlled mode after the charge pump output current drive is initialized. The control module may be implemented to compare a voltage of the charge pump output to a reference during the start-up mode, and to switch from the start-up mode to the feedback-controlled mode when the voltage of charge pump output is equal to the reference.

The control module may be implemented to configure the frequency control system in a reduced power-consumption mode, transition the frequency control system from the reduced power-consumption mode to the start-up mode, and transition the frequency control system from the start-up mode to the feedback-controlled mode.

The bias generator may correspond to an Nbias generator to generate the bias control as an Nbias control, and the frequency control apparatus may further include a Pbias generator to generate a Pbias control. The frequency control apparatus may further include a voltage controlled oscillator (VCO) to generate the output frequency, and a loop filter circuit to provide the operational control to the bias generator. The Nbias control may be applied to a component of the loop filter circuit and to the Pbias generator. The Pbias control may be provided to the VCO.

As further disclosed herein, a system may include a processor, a communication system to communicate with a network, communication infrastructure to permit communications amongst the processor, the communication system, and a user interface system, and a frequency control apparatus as described in one or more examples above, to provide an output frequency as a reference clock to one or more of the processor, the communication system, and the user interface system.

The processor, the communication system, and the frequency control system may be positioned within a housing.

The communication system may include a wireless communication system.

The processor, the communication system, a battery, and at least a portion of the user interface system may be positioned within the housing.

Methods and systems disclosed herein may be implemented in hardware, software, firmware, and combinations thereof, including discrete and integrated circuit logic, application specific integrated circuit (ASIC) logic, and microcontrollers, and may be implemented as part of a domain-specific integrated circuit package, and/or a combination of integrated circuit packages.

Methods and systems are disclosed herein with the aid of functional building blocks illustrating functions, features, and relationships thereof. At least some of the boundaries of these functional building blocks have been arbitrarily defined herein for the convenience of the description. Alternate boundaries may be defined so long as the specified functions and relationships thereof are appropriately performed.

While various embodiments are disclosed herein, it should be understood that they have been presented by way of example only, and not limitation. It will be apparent to persons skilled in the relevant art that various changes in form and detail may be made therein without departing from the spirit and scope of the methods and systems disclosed herein. Thus, the breadth and scope of the claims should not be limited by any of the examples provided herein.

What is claimed is:

1. An apparatus, comprising:

a voltage-controlled oscillator (VCO) to control an output signal based on a bias control;

a control system to configure the apparatus in a management mode and in a closed-loop feedback-controlled mode;

a bias feedback reference circuit to provide a bias feedback reference based on the bias control;

a first bias generator to generate the bias control based on a difference between the management control and the bias feedback reference in the management mode; and a second bias generator to generate the bias control based on a difference between a phase difference control and the bias feedback reference in the closed-loop feedback-controlled mode, wherein the phase difference control is based on a phase difference between the output signal and a reference signal.

2. The apparatus of claim 1, wherein the first bias generator is configured to consume less power in the management mode than the second bias generator is configured to consume in the closed-loop feedback-controlled mode.

3. The apparatus of claim 1, wherein the first bias generator is configured to consume less area than the second bias generator.

4. The apparatus of claim 1, wherein the first and second bias generators are configured as integrated circuits, and wherein the first bias generator is further configured with one or more of smaller channel lengths, smaller channel widths, and smaller feature sizes relative to the second bias generator.

5. The apparatus of claim 1, wherein the control system is configured to:

enable the first bias generator, disable the second bias generator, and provide the management control in the management mode; and disable the first bias generator and enable the second bias generator in the closed-loop feedback-controlled mode.

6. The apparatus of claim 1, wherein the management mode includes a startup mode, and wherein the control system is configured to place the apparatus in a reduced power-consumption state, transition from the reduced power-consumption state to the start-up mode, and transition from the start-up mode to the closed-loop feedback-controlled mode.

7. The apparatus of claim 6, further including a loop filter circuit to provide the phase difference control to the second bias generator in the closed-loop feedback-controlled mode, wherein the control system is further configured to:

disable the first and second bias generators and turn off one or more components of the loop filter circuit to place the apparatus in the reduced power consumption state;

turn on the one or more components of the loop filter circuit, enable the first bias generator, and set the management control to a startup reference voltage to transition from the reduced power consumption state to the start-up mode;

maintain the management control at the startup reference voltage and control the loop filter circuit to change a voltage of the phase difference control in the start-up mode; and disable the first bias generator and enable the second bias generator when the phase difference control is equal to the reference startup voltage to transition from the start-up mode to the closed-loop feedback-controlled mode.

8. The apparatus of claim 1, wherein the management mode includes a characterization mode, and wherein the control system is further configured to increment a voltage of the management control in the characterization mode.

9. The apparatus of claim 1, wherein the management mode includes a characterization mode and a startup mode, and wherein the control system is configured to place the apparatus in a reduced power-consumption state, transition from the reduced power-consumption state to the closed-loop feedback-controlled mode through one or more of the characterization mode and the start-up mode.

10. The apparatus of claim 9, further including a loop filter circuit to provide the phase difference control to the second bias generator in the closed-loop feedback-controlled mode, wherein the control system is further configured to:

disable the first and second bias generators and turn off one or more components of the loop filter circuit to place the apparatus in the reduced power consumption state;

turn on the one or more components of the loop filter circuit and enable the first bias generator to transition from the reduced power consumption state to the characterization mode;

increment a voltage of the management control in the characterization mode;

set the management control to a startup reference voltage to transition from the reduced power consumption state to the startup mode;

maintain the management control at the startup reference voltage and control the loop filter circuit to change a voltage of the phase difference control in the start-up mode; and disable the first bias generator and enable the second bias generator when the phase difference control is equal to the reference startup voltage to transition from the start-up mode to the closed-loop feedback-controlled mode.

11. The apparatus of claim 1, wherein:

the first bias generator includes a first operational amplifier configured to generate the bias control based on the difference between the management control and the bias feedback reference in the management mode; and the second bias generator includes a second operational amplifier configured to generate the bias control based on the difference between the phase difference control and the bias feedback reference in the closed-loop feedback-controlled mode.

12. The apparatus of claim 11, wherein:

the first operational amplifier includes a first set of differentially configured transistor devices;

the second operational amplifier includes a second set of differentially configured transistor devices; and the apparatus further includes one or more of, a shared load circuit coupled to each of the first and second sets of differentially configured transistor devices, and a shared bias circuit coupled to each of the first and second sets of differentially configured transistor devices.

13. The apparatus of claim 1, further including:

a first signal path to provide the management control from the control system to the first bias generator, exclusive of the phase difference control; and a second signal path to provide the phase difference control to the second bias generator, exclusive of the management control.

14. A system, comprising:

a processor and communication infrastructure to communicate amongst the processor and one or more of a user interface system and a communication network; and a frequency control system to provide an output frequency as a reference clock to one or more of the processor, the communication system, and the user interface system, wherein the frequency control system includes, a voltage-controlled oscillator (VCO) to control an output signal based on a bias control, a control system to configure the frequency control system in a management mode and in a closed-loop feedback-controlled mode, a bias feedback reference circuit to provide a bias feedback reference based on the bias control, a first bias generator to generate the bias control based on a difference between a management control and the bias feedback reference in the management mode, and a second bias generator to generate the bias control based on a difference between a phase difference control and the bias feedback reference in the closed-loop feedback-controlled mode, wherein the phase difference control is based on a phase difference between the output signal and a reference signal.

15. The system of claim 14, wherein the first bias generator is configured to consume less power in the management mode than the second bias generator is configured to consume in the closed-loop feedback-controlled mode.

16. The system of claim 14, wherein the first bias generator is configured to consume less area than the second bias generator.

17. The system of claim 14, wherein the first and second bias generators are configured as integrated circuits, and wherein the first bias generator is further configured with one or more of smaller channel lengths, smaller channel widths, and smaller feature sizes relative to the second bias generator.

18. The system of claim 14, wherein the control system is configured to:

enable the first bias generator, disable the second bias generator, and provide the management control in the management mode; and disable the first bias generator and enable the second bias generator in the closed-loop feedback-controlled mode.

19. The system of claim 14, wherein the management mode includes a startup mode, and wherein the control system is configured to place the apparatus in a reduced power-consumption state, transition from the reduced power-consumption state to the start-up mode, and transition from the start-up mode to the closed-loop feedback-controlled mode.

20. The system of claim 19, further including a loop filter circuit to provide the phase difference control to the second bias generator in the closed-loop feedback-controlled mode, wherein the control system is further configured to:

disable the first and second bias generators and turn off one or more components of the loop filter circuit to place the apparatus in the reduced power consumption state;

turn on the one or more components of the loop filter circuit, enable the first bias generator, and set the management control to a startup reference voltage to transition from the reduced power consumption state to the start-up mode;

maintain the management control at the startup reference voltage and control the loop filter circuit to change a voltage of the phase difference control in the start-up mode; and disable the first bias generator and enable the second bias generator when the phase difference control is equal to the reference startup voltage to transition from the start-up mode to the closed-loop feedback-controlled mode.

21. The system of claim 14, wherein the management mode includes a characterization mode, and wherein the control system is further configured to increment a voltage of the management control in the characterization mode.

22. The system of claim 14, wherein the management mode includes a characterization mode and a startup mode, and wherein the control system is configured to place the apparatus in a reduced power-consumption state, transition from the reduced power-consumption state to the closed-loop feedback-controlled mode through one or more of the characterization mode and the start-up mode.

23. The system of claim 22, further including a loop filter circuit to provide the phase difference control to the second bias generator in the closed-loop feedback-controlled mode, wherein the control system is further configured to:

disable the first and second bias generators and turn off one or more components of the loop filter circuit to place the apparatus in the reduced power consumption state;

turn on the one or more components of the loop filter circuit and enable the first bias generator to transition from the reduced power consumption state to the characterization mode;

increment a voltage of the management control in the characterization mode;

set the management control to a startup reference voltage to transition from the reduced power consumption state to the startup mode;

maintain the management control at the startup reference voltage and control the loop filter circuit to change a voltage of the phase difference control in the start-up mode; and disable the first bias generator and enable the second bias generator when the phase difference control is equal to the reference startup voltage to transition from the start-up mode to the closed-loop feedback-controlled mode.

24. The system of claim 14, wherein:

the first bias generator includes a first operational amplifier configured to generate the bias control based on the difference between the management control and the bias feedback reference in the management mode; and the second bias generator includes a second operational configured to generate the bias control based on the difference between the phase difference control and the bias feedback reference in the closed-loop feedback-controlled mode.

25. The system of claim 24, wherein:

the first operational amplifier includes a first set of differentially configured transistor devices;

the second operational amplifier that includes the second operational amplifier includes a second set of differentially configured transistor devices; and the frequency control system further includes one or more of, a shared load circuit coupled to each of the first and second sets of differentially configured transistor devices, and a shared bias circuit coupled to each of the first and second sets of differentially configured transistor devices.

26. The system of claim 14, further including:

a first signal path to provide the management control from the control system to the first bias generator, exclusive of the phase difference control; and a second signal path to provide the phase difference control to the second bias generator, exclusive of the management control.

* * * * *